United States Patent
Goldman-Shenhar et al.

(10) Patent No.: US 10,320,354 B1
(45) Date of Patent: Jun. 11, 2019

(54) CONTROLLING A VOLUME LEVEL BASED ON A USER PROFILE

(71) Applicant: GM Global Technology Operations LLC, Detroit, MI (US)

(72) Inventors: Claudia V. Goldman-Shenhar, Mevasseret Zion (IL); Laura Rosenbaun, Royal Oak, MI (US)

(73) Assignee: GM GLOBAL TECHNOLOGY OPERATIONS LLC, Detroit, MI (US)

(*) Notice: Subject to any disclaimer, the term of this patent is extended or adjusted under 35 U.S.C. 154(b) by 0 days.

(21) Appl. No.: 15/824,385

(22) Filed: Nov. 28, 2017

(51) Int. Cl.
| | | |
|---|---|---|
| *H03G 3/20* | (2006.01) | |
| *H03G 7/00* | (2006.01) | |
| *H04L 29/08* | (2006.01) | |
| *G10L 15/00* | (2013.01) | |
| *G06F 16/435* | (2019.01) | |

(52) U.S. Cl.
CPC .......... *H03G 7/007* (2013.01); *G06F 16/435* (2019.01); *G10L 15/00* (2013.01); *H03G 3/20* (2013.01); *H04L 67/10* (2013.01); *H04L 67/306* (2013.01)

(58) Field of Classification Search
CPC . H03G 7/007; H03G 3/20; H03G 5/16; G06F 17/30029
USPC ............... 381/56–57, 104–109, 103, 110
See application file for complete search history.

(56) References Cited

U.S. PATENT DOCUMENTS

| | | | | |
|---|---|---|---|---|
| 9,319,019 B2* | 4/2016 | Selig | ............ | G06F 3/165 |
| 9,948,256 B1* | 4/2018 | Dow | ............ | H03G 3/04 |
| 2014/0334644 A1* | 11/2014 | Selig | ............ | H03G 5/165 |
| | | | | 381/108 |
| 2016/0149547 A1* | 5/2016 | Rider | ............ | H03G 3/04 |
| | | | | 381/57 |

* cited by examiner

*Primary Examiner* — Disler Paul
(74) *Attorney, Agent, or Firm* — Cantor Colburn LLP

(57) ABSTRACT

Examples of techniques for controlling a volume of an audio device or system based on a user profile are disclosed. In one example implementation according to aspects of the present disclosure, a computer-implemented method includes generating, by a processing device, a user volume profile. The method further includes receiving, by the processing device, a volume command to change a volume level of audio. The method further includes determining, by the processing device, a volume change factor based at least in part on the user volume profile. The method further includes changing, by the processing system, the volume level of the audio based at least in part on the volume change factor.

13 Claims, 5 Drawing Sheets

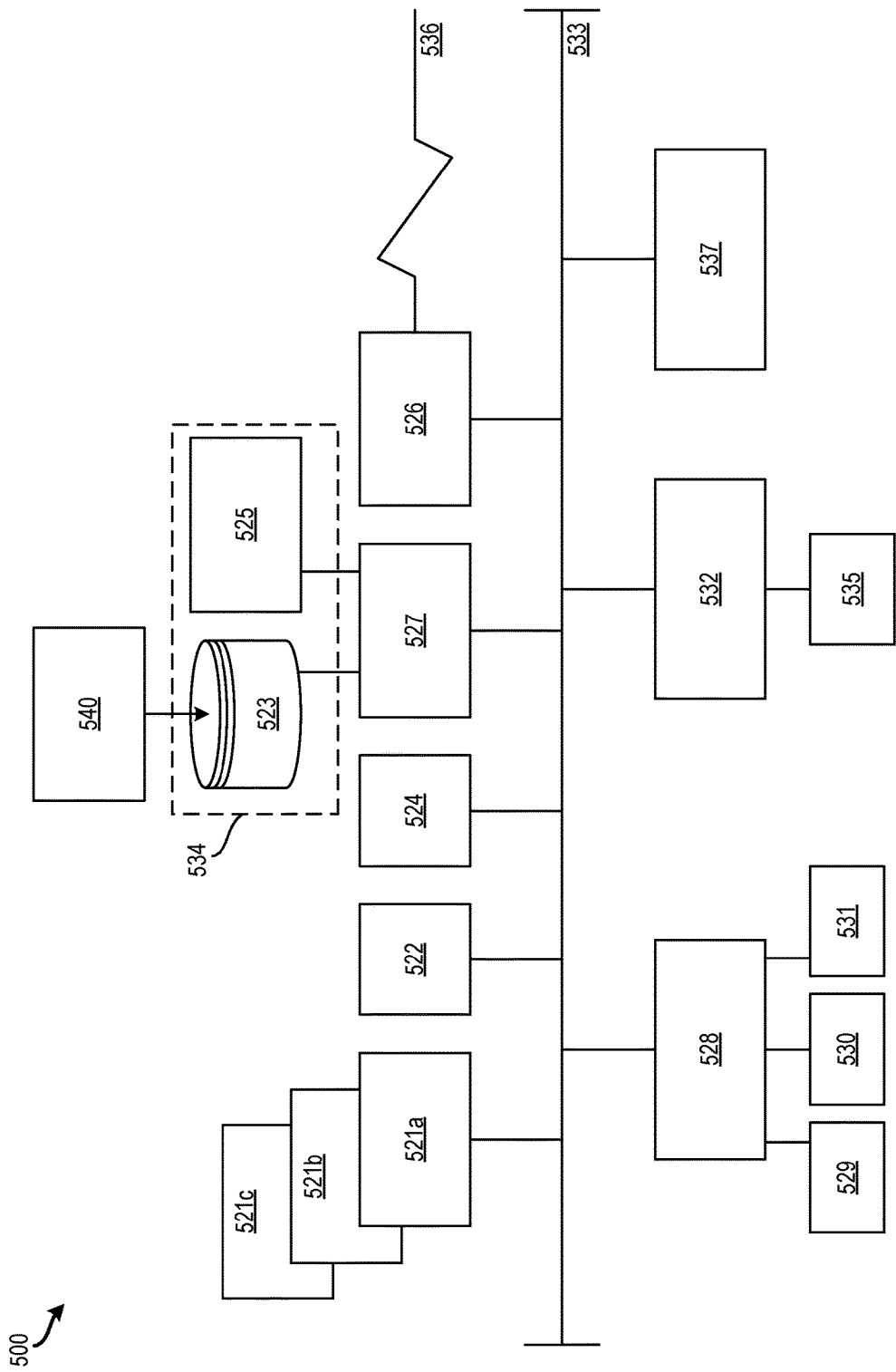

US 10,320,354 B1

CONTROLLING A VOLUME LEVEL BASED ON A USER PROFILE

INTRODUCTION

The present disclosure relates generally to data processing systems and more particularly to controlling a volume of an audio device or system based on a user profile.

Audio devices and systems output audio, such as music, voices, etc. It is often possible for a user (i.e., a listener) to adjust a volume level of the audio. For example, the user can increase or decrease the volume level. Typically, volume adjustments are performed manually by the user. For example, a user can press a button, turn a knob, move a slider, provide a voice prompt (e.g., "increase volume"), or perform another suitable action to adjust the volume.

SUMMARY

In one exemplary embodiment, a computer-implemented method for controlling a volume level based on a user profile includes generating, by a processing device, a user volume profile. The method further includes receiving, by the processing device, a volume command to change a volume level of audio. The method further includes determining, by the processing device, a volume change factor based at least in part on the user volume profile. The method further includes changing, by the processing system, the volume level of the audio based at least in part on the volume change factor.

In some examples, the method includes updating, by the processing device, the user volume profile based at least in part on the received volume command. In some examples, the user volume profile is a first user volume profile associated with a first user, and the method further includes generating, by the processing device, a second user volume profile associated with a second user. In some examples, the volume command is received via a human-machine interface. In some examples, the volume command is a spoken command. In some examples, the spoken command is at least one of a subjective command, a content-based command, a direct command, an indirect command, and a feature specific command. In some examples, determining the volume change factor is further based at least in part on a noise state. In some examples, determining the volume change factor is further based at least in part on a user state. In some examples, the method further includes storing, by the processing device, the user volume profile. In some examples, the user volume profile is stored in a cloud computing environment. In some examples, the volume command is an increase command, and changing the volume level includes increasing the volume level. In some examples, the volume command is a decrease command, and changing the volume level includes decreasing the volume level. In some examples, one or more of a plurality of users can adjust their respective volume level of one or more systems in an autonomous vehicle based at least in part on the user profile for the respective one or more of the plurality of users. In some examples, the volume level is a function of time, context, or a parameter of the user profile that is learned over time.

In another exemplary embodiment, a system for controlling a volume level based on a user profile includes a memory including computer readable instructions and a processing device for executing the computer readable instructions for performing a method. In examples, the method includes generating, by the processing device, a user volume profile. The method further includes receiving, by the processing device, a volume command to change a volume level of audio. The method further includes determining, by the processing device, a volume change factor based at least in part on the user volume profile. The method further includes changing, by the processing system, the volume level of the audio based at least in part on the volume change factor.

In yet another exemplary embodiment a computer program product for controlling a volume level based on a user profile includes a computer readable storage medium having program instructions embodied therewith, wherein the computer readable storage medium is not a transitory signal per se, the program instructions executable by a processing device to cause the processing device to perform a method. In examples, the method includes generating, by the processing device, a user volume profile. The method further includes receiving, by the processing device, a volume command to change a volume level of audio. The method further includes determining, by the processing device, a volume change factor based at least in part on the user volume profile. The method further includes changing, by the processing system, the volume level of the audio based at least in part on the volume change factor.

The above features and advantages, and other features and advantages, of the disclosure are readily apparent from the following detailed description when taken in connection with the accompanying drawings.

BRIEF DESCRIPTION OF THE DRAWINGS

Other features, advantages, and details appear, by way of example only, in the following detailed description, the detailed description referring to the drawings in which:

FIG. 5 depicts a block diagram of a processing system for implementing the techniques described herein, according to aspects of the present disclosure.

Figure 1:
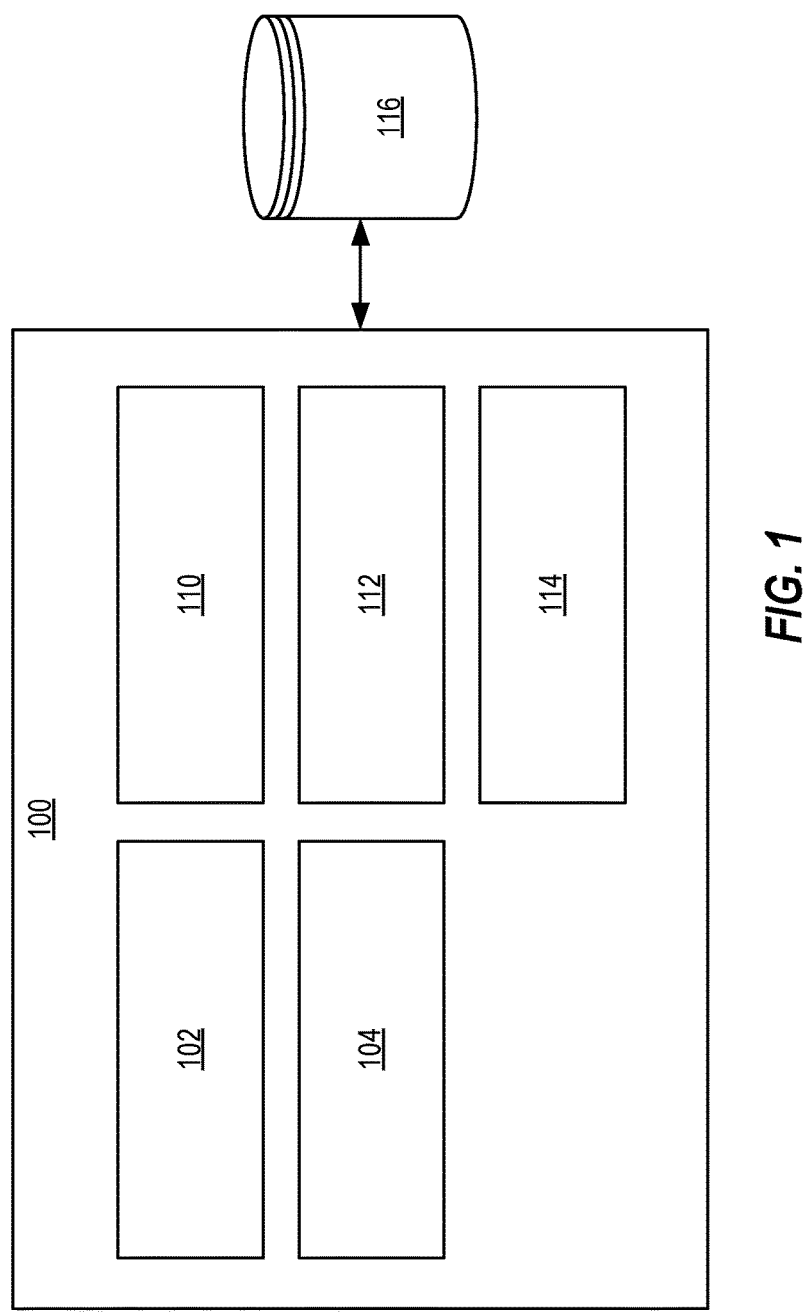
FIG. 1 depicts a block diagram of a processing system for controlling a volume of an audio device based on a user profile, according to aspects of the present disclosure.

The above features and advantages, and other features and advantages of the disclosure are readily apparent from the following detailed description when taken in connection with the accompanying drawings.

DETAILED DESCRIPTION

The following description is merely exemplary in nature and is not intended to limit the present disclosure, its application or uses. It should be understood that throughout the drawings, corresponding reference numerals indicate like or corresponding parts and features. As used herein, the term module refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

Controlling a volume level in an audio device or system typically includes a user manually adjusting the volume level via an input (e.g., a button, a knob, a slider, a voice input, etc.). An audio device or audio system is any device or system that produces audio (e.g., music, voices, alerts, etc.). Manual volume control is undesirable in certain situations, such as when a driver of a vehicle wants to change the volume while operating the vehicle. Although some audio devices or systems provide for automatic volume control to adjust the volume according to ambient noise (e.g., noise inside and/or outside the cabin of a vehicle), this adjustment is not personal to the user. For example, all users of the audio system providing the same volume level adjustment to a knob receive the same volume level of volume under similar noise conditions.

The technical solutions described herein provide for controlling a volume based on a user's profile to provide individualized volume control. In particular, the present techniques generate a user volume profile that is individual to the user. The user profile can include different types of information and also a volume change factor, described below. When a volume command is received to change a volume level of audio, a volume change factor can be determined based on the user volume profile. This can provide a single value, or a function, depending on other factors such as time, context, a fuzzy notion, etc. A function determines the amount of change (increase or decrease). The volume change factor can also be based on other considerations, such as a user state (e.g., the user's age, limitations, personal preferences, attentiveness, etc.) and a noise state (e.g., weather, road type, driving mode, car occupancy, etc.). The volume level of the audio is changed based on the volume change factor. The user's volume profile can be updated over time based on the user's actions and behavior. The volume change factor can be a number, a function, a table, a mathematical model, etc., that is input and produces an output to the audio device.

According to aspects of the present disclosure, a volume level of an audio system (such as the audio system of a vehicle) can be adjusted by a user by contacting the vehicle by speech (natural language), by a natural interface (adaptive interface accessible through various types of modalities, like visual, audio, gestures, etc.), or by any other suitable human-machine interface (HMI). The personalized volume system described herein is able to interpret the user volume command and adjust the volume accordingly based on the user's volume profile. The user profile is learned over time based on particular user needs for levels of volume. The present disclosure also provides techniques for dynamically adapting the volume level presented to the user considering noise (e.g., in-vehicle noise such as fan level, other users in the car, other applications being used, and mode (e.g., a sport mode during which engine noise might be higher than a standard mode); out-of-vehicle noise, such as road conditions, weather, traffic; etc.).

FIG. 1 depicts a block diagram of a processing system 100 for controlling a volume of an audio device based on a user profile, according to aspects of the present disclosure. The processing system 100 includes a processing device 102, a memory 104, a profile engine 110, a change factor determination engine 112, and a volume change engine 114. The user profile can reside on an audio device, on the processing system 100 (e.g., in a vehicle's audio system or in another component/system in the vehicle), on a cloud computing environment, on a user's device (e.g., a smartphone), etc.

The various components, modules, engines, etc. described regarding FIG. 1 can be implemented as instructions stored on a computer-readable storage medium, as hardware modules, as special-purpose hardware (e.g., application specific hardware, application specific integrated circuits (ASICs), as embedded controllers, hardwired circuitry, etc.), or as some combination or combinations of these.

In examples, the module(s), component(s), controller(s), engine(s), etc. described herein can be a combination of hardware and programming. The programming can be processor executable instructions stored on a tangible memory, and the hardware can include a processing device 102 (e.g., the processor 521 of FIG. 5) for executing those instructions. Thus a system memory 104 (e.g., random access memory 524 of FIG. 5) can store program instructions that when executed by the processing device 102 implement the engines described herein. Other engines, components, modules, controllers, etc. can also be utilized to include other features and functionality described in other examples herein.

As described in this example, the processing system 100 represents an audio system, although it should be appreciated that other audio devices and systems are possible. Accordingly, although not shown, the processing system 100 can include a speaker to output audio and an interface (e.g., an HMI) to enable a user to control, inter alia, the volume of the output audio.

One example of an algorithm for personalizing the volume level to a particular user proceeds as follows. A user interacts with the processing system 100 through speech or another interface (e.g., an HMI) to request a change in volume level. The processing system 100 recognizes whether the request is an increase or decrease. Additional speech analysis can be performed to understand whether the request refers to a smaller or larger step adjustment. A user profile can be generated, as described herein, to personalize the volume level to a particular user based on estimating the level of noise around the processing system 100 (e.g., in the cabin of a vehicle). This occurs when the user requests for an increase or decrease in volume occur during an interval of time. The increase or decrease change in volume level is updated. However, if a new request occurs after the interval of time (such as a certain period between two requests), the processing system 100 can use the last updated step stored in the user profile for the user. Based on known information on the user (e.g., the user state), initial values for volume change steps can be defined. For example, an elderly person with a hearing disability may have a starting step value of 2 units of volume change, whereas a person without hearing disability may have a starting step value of 1 unit of volume change.

More particularly, the profile engine 110 generates volume profiles for users of an audio device(s) or system(s), such as the processing system 100. Each user of the processing system 100 can have a personalized volume profile associated therewith to enable custom volume profiles per user. The learning of a user's needs in terms of volume level can be done on data collected from interactions with the user. The profile engine 110 stores the volume profile for each user in a data store, such as the profile database 116, which can be communicatively coupled to, or integrated into, the processing system 100. It should be appreciated that the profile database 116 can be stored in cloud computing environment, which is accessible from various processing systems and processing devices. This enables the volume profiles to be portable across different processing systems that the user accesses. In the example of the processing system 100 being an audio system in a vehicle, the user volume profile is accessible over a network or other communicative link such that the user volume profile can be retrieved for use in the vehicle.

According to aspects of the present disclosure, the profile engine 110 assigns a default increase increment and decrease increment, for example, 1 unit of volume change (e.g., −1 for a decrease and +1 for an increase). The profile engine 110 learns the user's needs for volume level adjustments and to enable adjustment of the volume level based on past experiences of the user. That is, with time, for different users, the same command (e.g., "increase the volume") can result in different increases depending on what was learned for the user. In an example, a command to increase (or decrease) the volume level increases (or decreases) the volume level based on the inputs of a user during a predetermined interval of time, which can be stored as part of the user profile (e.g., in the profile database 116) for future use.

The change factor determination engine 112 determines a volume change factor based at least in part on the user volume profile. The change factor determination engine 112 can also consider a user state (e.g., the user's age, limitations, personal preferences, attentiveness, etc.) and a noise state (e.g., weather, road type, driving mode, car occupancy, etc.) to determine the volume change factor. The volume change factor represents a multiplying factor that applies to the user's volume command. For example, if the user provides a command to increase the volume by 1 unit and the change factor determination engine 112 determines that the volume change factor is "3," then the volume is increased by 3 units. Similarly, if the user provides a command to decrease the volume by 2 units and the change factor determination engine 112 determines that the volume change factor is "1.2," then the volume is increased by 2.4 units. These represent only examples, and additional examples are also possible. According to aspects of the present disclosure, the result could be a function being computed between the value stated by the user and the volume change factor computed, which may be multiplication or another suitable mathematical operation. In some examples, the volume change factor can be based on multiple user volume profiles if multiple users are present (such as in a vehicle). As one such example, an average of all volume levels for the multiple users can be used to determine the volume change factor.

The volume change engine 114 implements the volume change by changing the volume level for audio based at least in part on the volume change factor. The profile engine 110, the change factor determination engine 112, and the volume change engine 114 are described in more detail herein.

Figure 2:
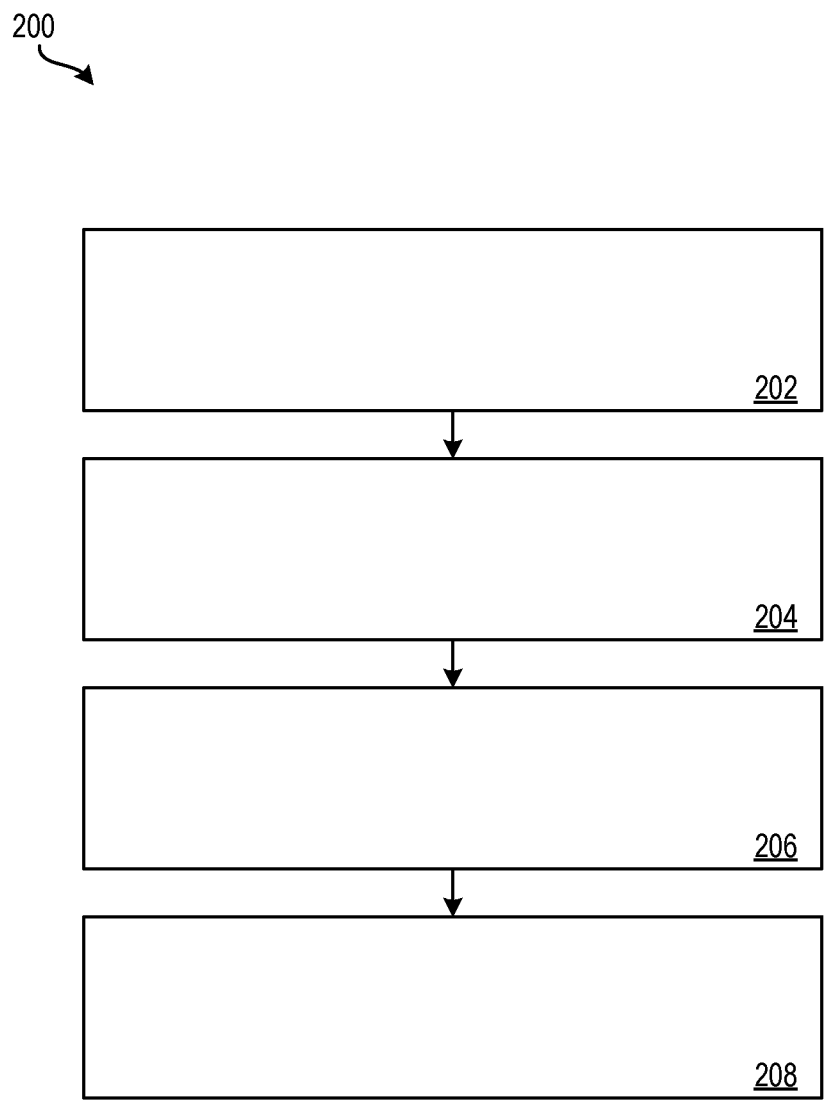
FIG. 2 depicts a flow diagram of a method for controlling a volume of an audio device based on a user profile, according to aspects of the present disclosure.

FIG. 2 depicts a flow diagram of a method 200 for controlling a volume of an audio device based on a user profile, according to aspects of the present disclosure. The method 200 can be implemented, for example, by the processing system 100 of FIG. 1, the processing system 300 of FIG. 3, the processing system 500 of FIG. 5, or by another suitable processing system or device or combination thereof At block 202, the profile engine 110 generates a user volume profile. The profile engine 110 can also update the user volume profile based the user's actions, such as how and when (e.g., a time of day, when a favorite song plays, etc.) the user increases or decreases volume. The user volume profile is associated with a particular user. The profile engine 110 recognizes a user in a number of ways and retrieves the volume profile associated with that particular user, such as from the profile database 116. For example, the profile engine 110 can recognize a user by recognizing the user's phone, key, smartwatch, etc. or the user can select his or her profile, such as from a list presented to the user. The profile engine 110 creates multiple profiles for each user. This enables personalized, individual volume control based on preferences and historical changes of the individual user.

At block 204, a processing device receives a volume command from a user to change a volume level of audio. The volume command can be received via an HMI or any other suitable interface. According to aspects of the present disclosure, the volume command is spoken by the user. Spoken volume commands can be subjective (e.g., "Turn it up a bit." or "Crank up the volume."), content based (e.g., "I wanna jam to today's pop hits."), direct (e.g., "Turn the volume down."), indirect (e.g., "This is too loud for me." or "I cannot hear the radio."), and/or feature specific (e.g., "That phone call was too high.").

According to aspects of the present disclosure, some spoken volume commands are clear in terms of being directed to adjusting an audio level (e.g., "Turn down the volume."). For these types of commands, the present techniques determine how much to turn up/down the volume as described herein. However, some spoken volume commands are not as clear. For example, a command such as "I wanna jam to today's pop hits" is less straightforward and there is an additional step of determining whether the user's intent is to increase or decrease the volume. In such cases, additional information may be used to help determine the volume change factor (described herein). For example, when the user says "jam" it is determined to mean a certain application that the user typically uses to play a song at a higher volume than is used by another application (e.g., a video player, an electronic game, etc.).

Subjective values are addressed based on the user's volume profile and/or rang markers (e.g., "a bit" or "all the way up"). Volume commands through indirect verbal commands, such as "the radio is too loud" are handled as requests to adjust the volume based on interpreted meaning of the indirect requests as well as on the user's volume profile or preferred volume. User requests of frequent audio content, such as "Let's jam to my favorite album." are handled both as a request to play particular audio content as well as an indirect request to adjust current volume level based on volume history for that given audio content.

At block 206, the change factor determination engine 112 determines a volume change factor based at least in part on the user volume profile. The change factor determination engine 112 can also determine the volume change factor based on any one, or a combination, of the user volume profile, a noise state, and a user state. The following pseudocode represents one possible technique for the change factor determination engine 112 to determine a volume change factor based on the user volume profile, the user state, and the noise state.

Get User-State(UserID)
    Get in-cabin and out-of-cabin parameters values
    t=0
    Determine Noise-State (in-cabin, out-of-cabin)=low|Medium|High
    Get-Volume-level (Noise-State, User-State)//initialized to default (Noise-State)
    Get Δα(Noise-State, User-State)//initialized to Δα(Noise-State)=0
    Δt=init value (Δt)//interval of time during which changes are relevant to each other
    t_LastChange=0//when the last change was requested
    While (user interacting with audio device){
        While user does not enter any input
            Δα(Noise-State, User-State)=Δα(Noise-State, User-State)

t++
If (user requests increase volume)&&(t-t_LastChange<Δt) then
  Δα(Noise-State, User-State)++//based on user state the increase can be larger or smaller if the HW allows this
  t_LastChange=t
t++
If (user requests decrease volume)&&(t-t_LastChange<Δt) then
  Δα(Noise-State, User-State)--//based on user state the decrease can be larger or smaller if the HW allows this
  t_LastChange=t
t++
If t-t_LastChange>=Δt then
  Δα(Noise-State, User-State)//taken from last update in User-State
  t_LastChange=t
  t=0
Volume-level (Noise-State, User-State)=Volume-level (Noise-State, User-State)+Δα(Noise-State, User-State)
Set Volume level to Volume-level (Noise-State, User-State)}
Store Δα(Noise-State, User-State)

In the example pseudo-code presented herein, Aa represents the change in volume level, and At represents the interval of time during which volume changes are relevant to each other. According to aspects of the present disclosure, a maximal value of volume can be defined. That is, even when the noise state is very high, the volume level is limited so that it does not increase indefinitely.

At block 208, volume change engine 114 changes the volume level of the audio based at least in part on the volume change factor.

Additional processes also can be included. For example, the profile engine 110 updates the user volume profile based on the received volume command. This enables the processing system 100 to learn from prior user inputs (e.g., volume adjustments) to update the user profile. It should be understood that the processes depicted in FIG. 2 represent illustrations and that other processes can be added or existing processes can be removed, modified, or rearranged without departing from the scope and spirit of the present disclosure.

Figure 3:
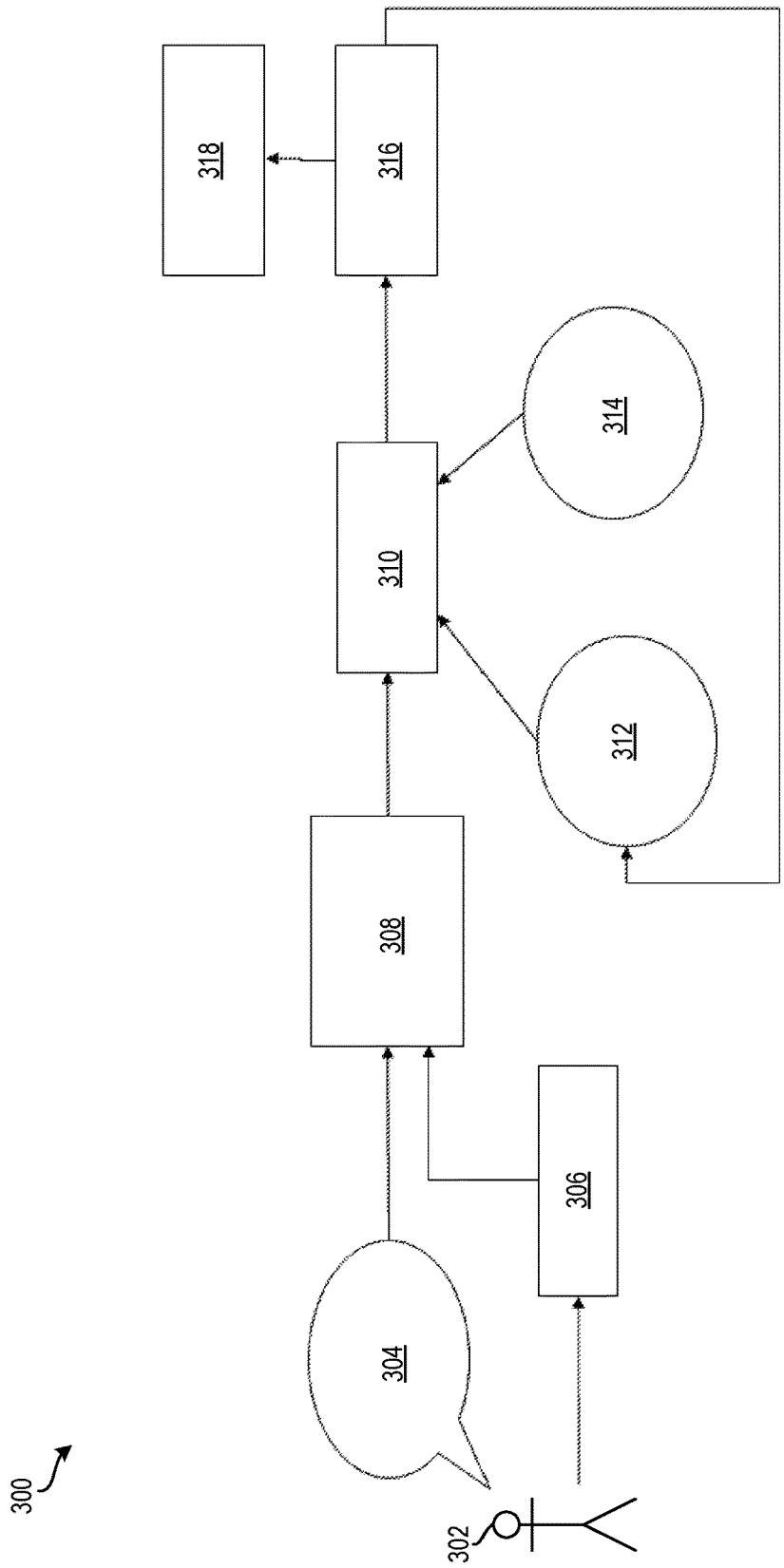
FIG. 3 depicts a block diagram of a processing system for controlling a volume of an audio device based on a user profile, according to aspects of the present disclosure.

FIG. 3 depicts a block diagram of a processing system 300 for controlling a volume of an audio device based on a user profile, according to aspects of the present disclosure. As depicted in FIG. 3, the processing system 300 is able to learn a user's (e.g., the user 302) needs in terms of volume level and can be performed using data collected from interactions with the user. Adding user state 312 and noise state 314 information can enhance this learning process.

The various components, modules, engines, etc. described regarding FIG. 3 can be implemented as instructions stored on a computer-readable storage medium, as hardware modules, as special-purpose hardware (e.g., application specific hardware, application specific integrated circuits (ASICs), as embedded controllers, hardwired circuitry, etc.), or as some combination or combinations of these.

In examples, the module(s), component(s), controller(s), engine(s), etc. described herein can be a combination of hardware and programming. The programming can be processor executable instructions stored on a tangible memory, and the hardware can include the processing device (e.g., the processor 521 of FIG. 5) for executing those instructions. Thus a system memory (e.g., random access memory 524 of FIG. 5) can store program instructions that when executed by the processing device implement the engines described herein. Other engines, components, modules, controllers, etc. can also be utilized to include other features and functionality described in other examples herein.

A user 302 provides to the processing system 300 a volume command 304 to change a volume level. The volume command 304 in this example is a spoken command, such as "Increase the volume" or "The music is too loud." The user is identified at block 306, and a user volume profile associated with the user is retrieved (such as from a cloud computing environment or a local data repository). The volume command 304 and the user information (e.g., user ID, user profile, etc.) are fed into a human-machine interface 308, which can perform speech recognition, natural language processing, etc.), and the volume command 304 is converted into a user input, which is provided to a change factor determination module 310.

The change factor determination module 310 determines a volume change factor based on the user input, which includes the user volume profile. The change factor determination module 310 also considers a user state 312 (e.g., an age of the user (which can indicate volume level preferences or limitations), audio limitations of the user, personal preferences of the user, attentiveness of the user, etc.) and/or a noise state 314 (e.g., weather, road conditions, ambient noise, driving mode, vehicle occupancy, other applications running on the processing system 300, etc.). Using the user state 312 and/or the noise state 314 as well as the user volume profile, the change factor determination module 310 determines the volume change factor.

Once the change factor is determined, it is provided to a volume controller 316 to implement the volume adjustment in an audio output device 318 (e.g., a speaker). The change factor is also fed back into the user state 312 to update the user's personal preferences and behavior based on the determined volume change factor. This enables the user profile for the user to be personalized based on the user's preferences and behavior. In some examples, one or more of a plurality of users can adjust their respective volume level of one or more systems (e.g., navigation, radio, alerts, entertainment, etc.) in an autonomous vehicle based at least in part on the user profile for the respective one or more of the plurality of users.

Figure 4:
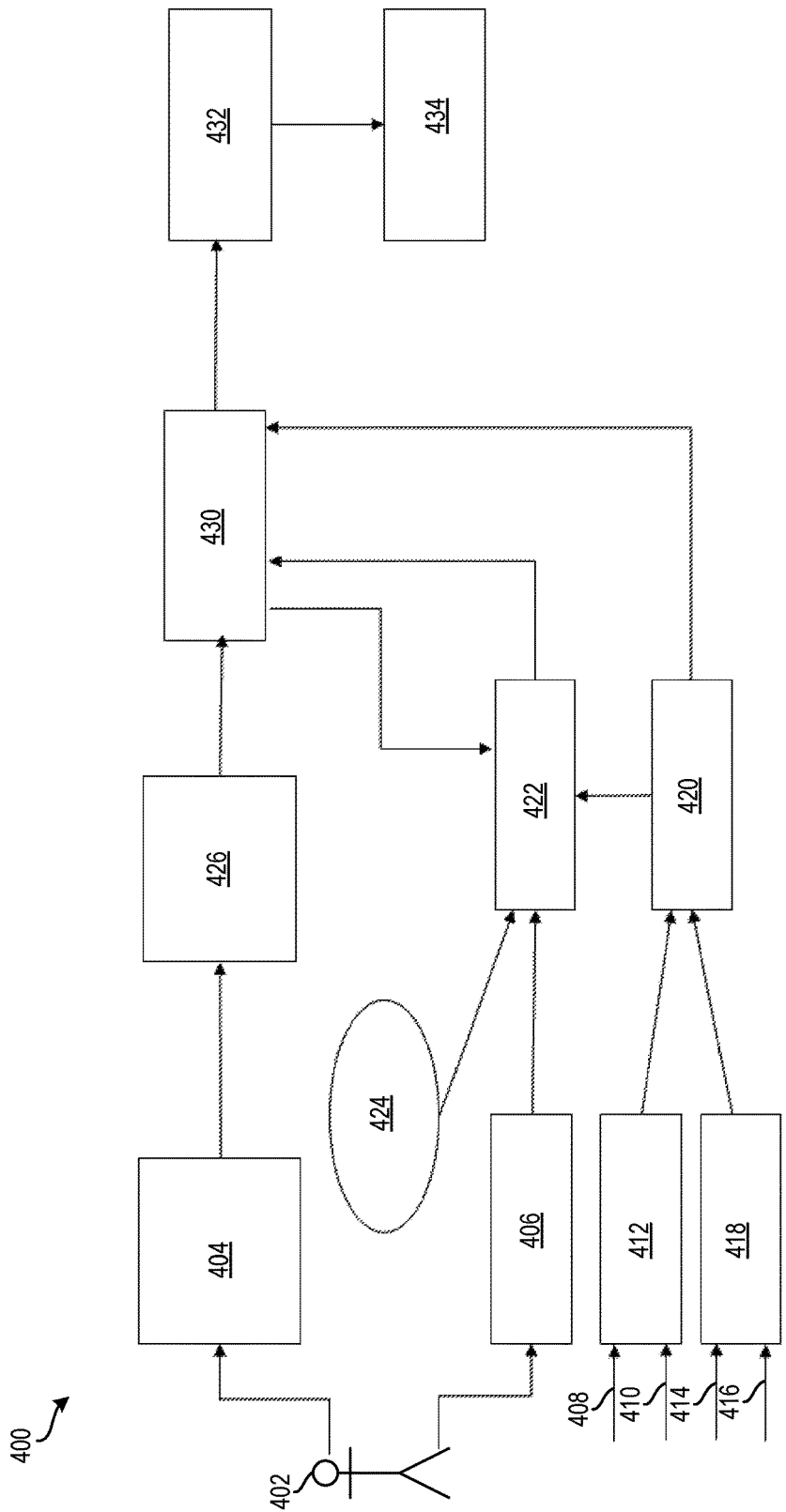
FIG. 4 depicts a flow diagram of a method for controlling a volume of an audio device based on a user profile, according to aspects of the present disclosure.

FIG. 4 depicts a flow diagram of a method 400 for controlling a volume of an audio device based on a user profile, according to aspects of the present disclosure. The method 200 can be implemented, for example, by the processing system 100 of FIG. 1, the processing system 300 of FIG. 3, the processing system 500 of FIG. 5, or by another suitable processing system or device or combination thereof.

A user 402 provides a volume command to change a volume level of audio. The volume command is fed into an HMI 404 and a user is identified at block 406. Based on the user's ID, a user volume profile associated with the user is retrieved (such as from a cloud computing environment or a local data repository).

Simultaneously, concurrently, or at another time, inputs 408, 410 are fed into an in-cabin noise module 412 and inputs 414, 416 are fed into an out-of-cabin noise module 418. In the case of the in-cabin noise module 412, the inputs 408, 410 can indicate a driving mode (e.g., sport, standard, economy, etc.), a fan speed of a cooling system (e.g., 5 on a scale from 1 to 7), etc., which contribute to how much noise is occurring in the cabin of a vehicle. Similarly, in the case of the out-of-cabin noise module 418, the inputs 414, 416 can indicate a weather condition (e.g., rain, wind, calm, etc.), a highway noise (e.g., lots of traffic, rough road, etc.), which contribute to how much noise is occurring outside the cabin of the vehicle. Together, the outputs of the in-cabin noise module 412 and the out-of-cabin noise module 418 are input into the noise state module 420, which indicates a noise state. The noise state can be fed into the user state module 422 and a change factor determination module 430.

The user state module 422 can use a context 424 (e.g., is the user on a phone call, what type of music is playing, etc.) of the volume command to determine the user's state. Together, the user state and the noise state can be fed into the change factor determining module 430, which determines a volume change factor based on the user input, which includes the user volume profile, the noise state, and/or the user state. The change factor determining module 430 also considers whether the volume command requests an increase or a decrease as determined at block 426.

Once the volume change factor is determined by the change factor determining module 430, the change factor is provided to a volume controller 432 to implement the volume adjustment in an audio output device 434 (e.g., a speaker). The change factor is also fed back into the user state module 422 to update the user's personal preferences and behavior based on the determined volume change factor. This enables the user profile for the user to be personalized based on the user's preferences and behavior.

It is understood in advance that the present disclosure is capable of being implemented in conjunction with any other type of computing environment now known or later developed. For example, FIG. 5 illustrates a block diagram of a processing system 500 for implementing the techniques described herein. In examples, processing system 500 has one or more central processing units (processors) 521a, 521b, 521c, etc. (collectively or generically referred to as processor(s) 521 and/or as processing device(s)). In aspects of the present disclosure, each processor 521 can include a reduced instruction set computer (RISC) microprocessor. Processors 521 are coupled to system memory (e.g., random access memory (RAM) 524) and various other components via a system bus 533. Read only memory (ROM) 522 is coupled to system bus 533 and can include a basic input/output system (BIOS), which controls certain basic functions of processing system 500.

Further illustrated are an input/output (I/O) adapter 527 and a network adapter 526 coupled to system bus 533. I/O adapter 527 can be a small computer system interface (SCSI) adapter that communicates with a hard disk 523 and/or other storage drive 525 or any other similar component. I/O adapter 527, hard disk 523, and storage device 525 are collectively referred to herein as mass storage 534. Operating system 540 for execution on processing system 500 can be stored in mass storage 534. A network adapter 526 interconnects system bus 533 with an outside network 536 enabling processing system 500 to communicate with other such systems.

A display (e.g., a display monitor) 535 is connected to system bus 533 by display adaptor 532, which can include a graphics adapter to improve the performance of graphics and general computation intensive applications and a video controller. In one aspect of the present disclosure, adapters 526, 527, and/or 532 can be connected to one or more I/O buses that are connected to system bus 533 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 533 via user interface adapter 528 and display adapter 532. A keyboard 529, mouse 530, and speaker 531 can be interconnected to system bus 533 via user interface adapter 528, which can include, for example, a Super I/O chip integrating multiple device adapters into a single integrated circuit.

In some aspects of the present disclosure, processing system 500 includes a graphics processing unit 537. Graphics processing unit 537 is a specialized electronic circuit designed to manipulate and alter memory to accelerate the creation of images in a frame buffer intended for output to a display. In general, graphics processing unit 537 is very efficient at manipulating computer graphics and image processing, and has a highly parallel structure that makes it more effective than general-purpose CPUs for algorithms where processing of large blocks of data is done in parallel.

Thus, as configured herein, processing system 500 includes processing capability in the form of processors 521, storage capability including system memory (e.g., RAM 524), and mass storage 534, input means such as keyboard 529 and mouse 530, and output capability including speaker 531 and display 535. In some aspects of the present disclosure, a portion of system memory (e.g., RAM 524) and mass storage 534 collectively store an operating system to coordinate the functions of the various components shown in processing system 500.

The descriptions of the various examples of the present disclosure have been presented for purposes of illustration, but are not intended to be exhaustive or limited to the embodiments disclosed. Many modifications and variations will be apparent to those of ordinary skill in the art without departing from the scope and spirit of the described techniques. The terminology used herein was chosen to best explain the principles of the present techniques, the practical application or technical improvement over technologies found in the marketplace, or to enable others of ordinary skill in the art to understand the techniques disclosed herein.

While the above disclosure has been described with reference to exemplary embodiments, it will be understood by those skilled in the art that various changes can be made and equivalents can be substituted for elements thereof without departing from its scope. In addition, many modifications can be made to adapt a particular situation or material to the teachings of the disclosure without departing from the essential scope thereof. Therefore, it is intended that the present techniques not be limited to the particular embodiments disclosed, but will include all embodiments falling within the scope of the application.

What is claimed is:

1. A computer-implemented method for controlling a volume level based on a user profile, the method comprising:
   generating, by a processing device, a user volume profile, the user volume profile being associated with a first user;
   receiving, by the processing device, a volume command from the first user to change a volume level of audio;
   determining, by the processing device, a volume change factor for the first user based at least in part on the user volume profile for the first user, the volume change factor representing a multiplying factor that applies to the volume command received from the first user, the volume change factor being based at least in part on a noise state and a user state, the noise state being determined based at least in part on a weather condition, a traffic condition, a road condition, ambient noise, a driving mode of a vehicle, and a vehicle occupancy, and the user state being determined based at least in part on an age of the user, audio limitations of the user, personal preferences of the user, and attentiveness of the user, wherein the road condition indicates that a road over which the vehicle is traveling is a rough road; and changing, by the processing device, the volume level of the audio based at least in part on the volume change factor for the first user by applying the multiplying factor to the volume command.

2. The computer-implemented method of claim 1, further comprising updating, by the processing device, the user volume profile based at least in part on the received volume command.

3. The computer-implemented method of claim 1, wherein the user volume profile is a first user volume profile associated with the first user, and wherein the method further comprises generating, by the processing device, a second user volume profile associated with a second user.

4. The computer-implemented method of claim 1, wherein the volume command is received via a human-machine interface.

5. The computer-implemented method of claim 1, wherein the volume command is a spoken command.

6. The computer-implemented method of claim 5, wherein the spoken command is at least one of a subjective command, a content-based command, a direct command, an indirect command, and a feature specific command.

7. The computer-implemented method of claim 1, further comprising storing, by the processing device, the user volume profile.

8. The computer-implemented method of claim 7, wherein the user volume profile is stored in a cloud computing environment.

9. The computer-implemented method of claim 1, wherein the volume command is an increase command, and wherein changing the volume level comprises increasing the volume level by applying the multiplying factor to the increase command.

10. The computer-implemented method of claim 1, wherein the volume command is a decrease command, and wherein changing the volume level comprises decreasing the volume level by applying the multiplying factor to the decrease command.

11. The computer-implemented method of claim 1, wherein one or more of a plurality of users can adjust their respective volume level of one or more systems in an autonomous vehicle based at least in part on the user profile for the respective one or more of the plurality of users.

12. The computer-implemented method of claim 1, wherein the volume level is a function of time, context, or a parameter of the user profile that is learned over time.

13. A system for controlling a volume level based on a user profile, the system comprising:

a memory comprising computer readable instructions; and a processing device for executing the computer readable instructions for performing a method, the method comprising:

generating, by the processing device, a user volume profile, the user volume profile being associated with a user;

receiving, by the processing device, a volume command to change a volume level of audio;

determining, by the processing device, a volume change factor for the user based at least in part on the user volume profile for the user, the volume change factor representing a multiplying factor that applies to the volume command received from a user, the volume change factor being based at least in part on a noise state and a user state, the noise state being determined based at least in part on a weather condition, a traffic condition, a road condition, ambient noise, a driving mode of a vehicle, and a vehicle occupancy, and the user state being determined based at least in part on an age of the user, audio limitations of the user, personal preferences of the user, and attentiveness of the user, wherein the road condition indicates that a road over which the vehicle is traveling is a rough road;

subsequent to determining the volume change factor for the user, updating, by the processing device, the user state based at least in part on the volume change factor; and changing, by the processing system, the volume level of the audio based at least in part on the volume change factor for the user by applying the multiplying factor to the volume command.

* * * * *